United States Patent [19]
Nath et al.

[11] Patent Number: 5,228,925
[45] Date of Patent: Jul. 20, 1993

[54] PHOTOVOLTAIC WINDOW ASSEMBLY

[75] Inventors: Prem Nath, Rochester Hills; Avtar Singh, Roseville, both of Mich.

[73] Assignee: United Solar Systems Corporation, Troy, Mich.

[21] Appl. No.: 811,645

[22] Filed: Dec. 23, 1991

[51] Int. Cl.$^5$ .......................................... H01L 31/048
[52] U.S. Cl. .................................. 136/251; 136/291; 296/215
[58] Field of Search ................. 136/251, 291; 296/215

[56] References Cited

U.S. PATENT DOCUMENTS

| | | | |
|---|---|---|---|
| 4,327,316 | 4/1982 | Fujikubo et al. | 320/2 |
| 4,475,031 | 10/1984 | Mockovciak, Jr. | 250/212 |
| 4,724,010 | 2/1988 | Okaniwa et al. | 136/246 |
| 4,773,944 | 9/1988 | Nath et al. | 136/249 |
| 5,011,544 | 4/1991 | Gaddy et al. | 136/246 |
| 5,066,338 | 11/1991 | Meyers | 136/244 |

Primary Examiner—Aaron Weisstuch
Attorney, Agent, or Firm—Krass & Young

[57] ABSTRACT

A photovoltaic window assembly suitable for use in building and vehicular applications. The window assembly includes an optically-transmissive substrate having one or more photovoltaic devices disposed thereon. A decorative template having cut-outs coextensive with each of the photovoltaic devices is disposed on the substrate such that the photovoltaic devices extend through the cut-outs. A window opening is also formed in the decorative template for transmission of light. An encapsulating layer is formed on the substrate, solar cells and decorative template to protect the solar cells and assembly from environmental damage and deterioration.

17 Claims, 2 Drawing Sheets

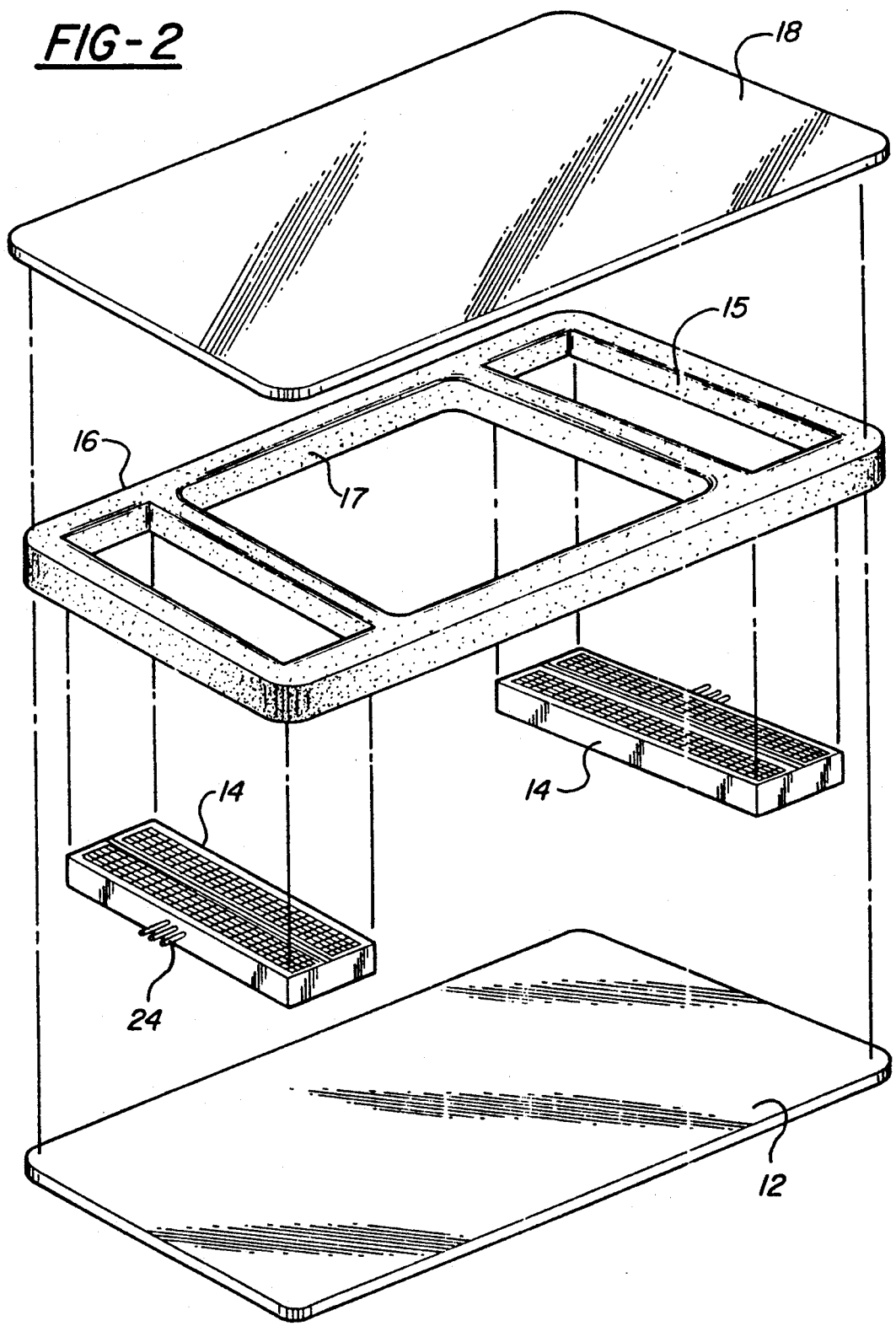

PHOTOVOLTAIC WINDOW ASSEMBLY

FIELD OF THE INVENTION

This invention relates generally to the field of photovoltaic devices and, more particularly, to such a device incorporated into a window assembly suitable for automotive and architectural usage.

BACKGROUND OF THE INVENTION

A photovoltaic device is one which converts sunlight directly into electricity. Although photovoltaic devices are not yet in widespread use in applications which require the generation of large amounts of electricity, such as electrical power plants, they have come into daily usage in applications where only small amounts of current are required. For example, photovoltaic devices are common in such consumer items as calculators, watches, outdoor lighting, etc. Typically, these products have the photovoltaic devices built in so that a continuous supply of electricity is available to power the various items as long as the solar cells are exposed to light. Storage devices, such as solar batteries, may be provided to store the generated electricity during periods of darkness.

Obviously, it is the convenience of such consumer items that has made them popular. By incorporating the power source directly into the product, the ultimate in convenience is achieved.

There are other applications wherein a built-in source of continuous electrical power would be extremely useful. For example, cars which are left outside for long periods of time (such as in airport parking lots) often experience starting problems due to low battery levels. Hence, a variety of photovoltaic devices which may be connected to the electrical system of the car (such as via the cigarette lighter) may be used to trickle charge the battery. See, for example, U.S. Pat. No. 4,327,396. Similarly, automobiles which are parked out in the hot sun for even short periods of time absorb sufficient solar energy to raise the interior temperature to uncomfortable levels. Small fans which draw low levels of power are available on the market to exhaust the solar heated air from the car's interior and circulate cooler, outside air. Such fans can be powered the car's electrical system, or can be solar powered.

Houses and other buildings could also benefit from a source of electricity provided by photovoltaic devices which is independent of the building's central power supply. For example, in cases of power outage, it would be extremely useful to have an auxiliary source of electrical power.

Of course, there are various photovoltaic modules available on the market which can be used in both building and vehicular applications to generate auxiliary power. However, these modules have not come into widespread use for a variety of reasons. See, for example, U.S. Pat. Nos.: 4,724,010; 4,475,031; and 4,773,944. Important disadvantages are that they tend to be unsightly, or are add-ons, which are inconvenient and space-consuming.

It would desirable to provide an auxiliary source of power which may easily be incorporated into buildings, vehicles, and the like, either when they are manufactured or as a retrofit. However, in order to be commercially successful, such a product should ideally integrate both aesthetically and structurally with the building or vehicle and should not be obtrusive, unsightly, or inconvenient to use.

SUMMARY OF THE INVENTION

Disclosed and claimed herein is a photovoltaic window assembly which comprises a rigid or semi-rigid, optically-transmissive substrate with at least one photovoltaic device disposed on and overlying a portion of the substrate. A decorative, preferably opaque, template is also disposed on the substrate and has means forming a first aperture coextensive with the photovoltaic device. The template further includes means forming a second aperture to define a window opening. An encapsulating layer of optically-transmissive environmentally-impervious material is disposed on the substrate to encapsulate the photovoltaic device.

In one preferred embodiment, the decorative template and the photovoltaic device are disposed on the same surface of the substrate such that the template is disposed adjacent the photovoltaic device. In this embodiment, the encapsulating layer is disposed on the substrate, the photovoltaic device and the template to encapsulate them all.

In an alternate embodiment, the substrate has first and second surfaces, with the photovoltaic device being disposed on the first surface and the template being disposed on the second surface. When a device according to this alternate embodiment is installed in a vehicle or a building, the transparent substrate may face outwardly toward the environment, thus serving to seal and protect the window assembly.

In a particularly preferred embodiment, the assembly of the present invention is designed as the sunroof or moonroof of an automobile. Thus, the substrate is appropriately shaped and contoured to fit in the sunroof or moonroof opening of the car. One or two photovoltaic devices are disposed on the appropriately configured substrate. The decorative template has first apertures coextensive with the photovoltaic devices, as well as a second aperture which forms the actual sunroof or moonroof opening. The template is appropriately styled and contoured to harmonize with the roof of the car and serves to cover up any electrical connections, as well as to form a frame for the window opening.

The window assembly of the present invention further comprises an electrical connector which is in electrical communication with the photovoltaic device. The connector is adapted to be connected to, for example, the electrical system of an automobile, or the central power supply of the building. In this manner, the window assembly can serve as an auxiliary power supply even when the main power supply is non-operative.

BRIEF DESCRIPTION OF THE DRAWINGS

The following detailed description may best be understood by reference to the drawings, in which:

FIG. 2 is an exploded view of the window assembly of FIG. 1 showing details of the construction thereof.

DETAILED DESCRIPTION OF THE PREFERRED EMBODIMENTS

Figure 1:
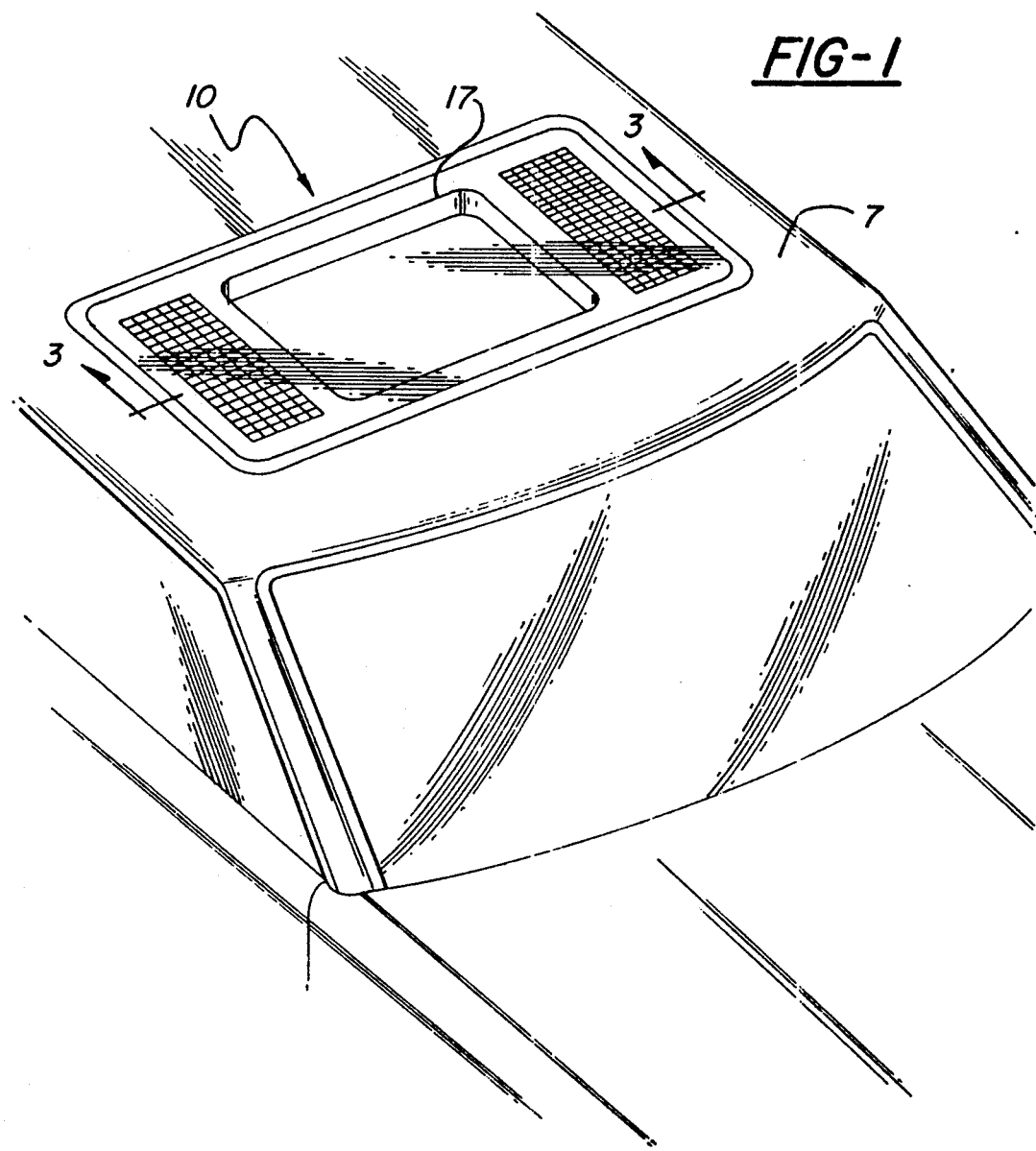
FIG. 1 is a perspective view of a device according to the present invention mounted in a sunroof opening formed in the top of a vehicle.

Throughout the following detailed description, like reference numerals are used to refer to the same elements of the invention shown in multiple figures thereof. Referring now the drawings, and in particular to FIG. 1 there is shown a window assembly 10 according to the present invention which, in the embodiment depicted, serves as the sunroof panel for a motor vehicle 7. In the embodiment depicted in FIG. 1, the window assembly is contoured and shaped appropriately to harmonize with the styling of the motor vehicle 7, but it is to be understood that other embodiments of the window assembly of the present invention may present considerably different appearances. For example, the window assembly 7 could, if made flat and rectangular, be used as a skylight, in which case it would be mounted in the roof of a building. It could also be used as a regular, vertically disposed window in a building.

Figure 3:
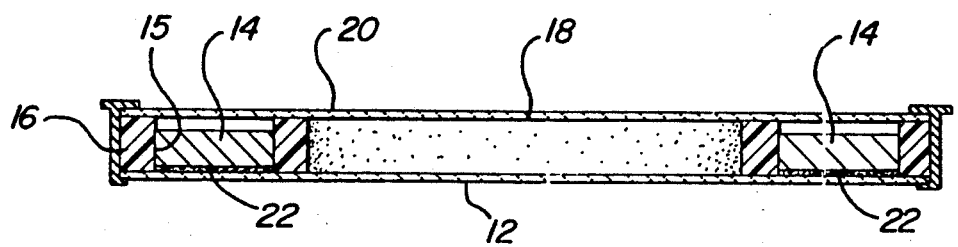
FIG. 3 is a cross-sectional view of the window assembly of FIG. 1 taken along lines 3—3 thereof.

By referring to the exploded view depicted in FIG. 2 and the cross-sectional view of FIG. 3, the details of the window assembly 10 of the present invention may best be appreciated. The window assembly 10 includes a substrate 12 which is formed of a rigid or semi-rigid, optically-transmissive material, such as glass, Lucite ®, acrylic plastic, other types of suitable transparent polymeric sheet material, etc. Preferably, the substrate 12 is formed of tempered safety glass. In the case of the embodiment depicted in FIGS. 1, 2, and 3, the substrate 12 is suitably configured and contoured to serve as the sunroof for motor vehicle 7. Disposed on substrate 12 are a pair of photovoltaic devices 14, each having an associated electrical connector 24 in electrical communication with the photovoltaic device 14 so that the electrical power thereby generated may be made available. For example, the connectors 24 may be then connected to the electrical system (not shown) of the motor vehicle 7.

The photovoltaic device 14 may be of any design known in the prior art, such as a single crystal silicon device, a thin film amorphous silicon alloy or silicon/germanium alloy type, etc. However, the thin film, amorphous type of photovoltaic device is particularly suitable for use in the present invention. Examples of such thin, amorphous photovoltaic devices are disclosed in, for example, U.S. Pat. Nos.: 4,217,374; 4,226,898; and 4,773,944. As explained in these references, the thin film, amorphous photovoltaic cells are formed by depositing successive layers of semiconductor material on a substrate, which can be a flexible substrate. The successive layers are suitably modified with various dopants to create N, I, and P layers. The photovoltaic device may further include a bottom electrode (either formed by the substrate itself, or deposited thereon) and a top electrode formed of a conductive, but optically-transmissive material such as indium tin oxide. If formed on a suitably flexible substrate, the thin film layers deposited thereon will not affect the flexibility of the resultant device; a flexible device may be easily fabricated by relatively inexpensive, roll to roll manufacturing techniques. Since the present invention may be practiced with a variety of both single cell, crystalline, and thin film amorphous solar cells, the exact details of construction of the photovoltaic device, itself, are not considered to be of patentable significance and will not be discussed in greater detail hereafter. However, due to its flexibility, the thin film, amorphous photovoltaic cell is particularly suitable for use in the present invention since it will readily adopt a variety of contours and configurations.

Also disposed on substrate 12 is a decorative template 16 which has a pair of first apertures 15 formed therein. First apertures 15 are coextensive with photovoltaic devices 14. As can best be appreciated by examining the cross-sectional view of FIG. 3, the decorative template 16 of the depicted embodiment is preferably disposed on the same surface of substrate 12 as are the photovoltaic devices 14. Thus, portions of the decorative templates 16 lie adjacent photovoltaic devices 14, with the photovoltaic devices 14 extending into the first apertures 15. Alternatively, decorative template 16 could be disposed on an opposite surface of substrate 12, in which case first apertures 15 would still be aligned with photovoltaic devices 14, but the photovoltaic devices 14 would not extend into the first apertures 15.

A layer of encapsulating material 18 overlies and encapsulates substrate 12, photovoltaic devices 14, and decorative template 16. The purpose of layer 18 is to seal photovoltaic cells 14 from the external environment. The layer 18 must be formed of an optically-transmissive material. In a preferred embodiment, layer 18 is formed of a copolymer such as ethylene vinyl acetate or EVA. EVA has the distinct advantages of flowing like a liquid at elevated temperatures, and it also bonds well with glass. Hence, EVA is also used as an adhesive in practicing the present invention, and it was been found desirable to include a layer of EVA adhesive 22 between the substrate 12 and the photovoltaic devices 14 and template 16 in order to bond them together.

Preferably, a coating 20 of a transparent polymer such as a floral polymer/Teflon combination (commercially available under the trade name Tefzel TM is disposed on top of encapsulating layer 18. Coating layer 20 provides further environmental protection and helps encapsulate window assembly 10. It also provides a safety net in case the glass breaks. The layer 20 of Tefzel TM is, preferably, vacuum laminated onto encapsulating layer 18.

Decorative template 16 further includes a second aperture 17 which is configured to form a window opening. Second aperture 17 overlies only optically-transmissive substrate 12 (and optically-transmissive adhesive layer 22) so that incident light falling on window assembly 10 is transmitted through second aperture 17 to form a clear window opening. If it is desired, the window assembly 10 may be texturized and reinforced by including a fine fiberglass net (not shown) in encapsulating layer 18. By incorporating the fiberglass net, the window can have the features of a safety window; it will not shatter on impact. Thus, it may be substituted for tempered safety glass in many applications.

Preferably, decorative template 16, which may be formed of a variety of materials such as rubber, polymers, various metals, etc. is made to be optically opaque. It may be designed to overlie and cover up any protruding wires or electrical elements necessarily part of photovoltaic cells 14 but which, because of their unsightly appearance, should not be visible. Thus, by suitably designing decorative template 16, the window assembly 10 of the present invention presents an aesthetically pleasing appearance since all that is visible is the transparent window area, the surface of the solar cells, and the decorative template.

Although depicted with one window opening and two solar cells, the window assembly of the present invention may have other numbers of solar cells and may have more than one window opening. Furthermore, the decorative template may have a variety of aesthetic features incorporated thereinto, such as molded designs, painted designs, contrast stripe, etc. Such design variations are considered to be within the skill of one knowledgeable in the art of window design and fabrication of photovoltaic modules. As such, all such variations are considered to fall within the scope of the present invention. It is the following claims and all equivalents thereof, rather than the various embodiments and exemplifications described and depicted herein, that define the scope of the present invention.

We claim:

1. A modular photovoltaic window assembly comprising:
   a rigid or semi-rigid, optically-transmissive substrate;
   at least one large area photovoltaic device disposed on and overlying a portion of said substrate and including at least one electrical connector in electrical communication with said photovoltaic device and disposed proximate an edge thereof;
   a decorative template disposed on said substrate and having a first aperture coextensive with said photovoltaic device such that said first aperture exposes all but said electrical connector thereof, and a second aperture defining a window opening; and
   a layer of optically-transmissive, environmentally-impervious material encapsulating said photovoltaic device and said substrate.

2. The window assembly of claim 1 wherein said template is disposed adjacent said photovoltaic device on one surface of said substrate, and said layer or impervious material further encapsulates said template.

3. The window assembly of claim 2 further comprising a layer of ethylene vinyl acetate disposed between said template and adjacent photovoltaic device and said substrate to bond said template and adjacent photovoltaic device to said substrate.

4. The window assembly of claim 1 wherein said substrate has first and second surfaces, said photovoltaic device being disposed on said first surface, and said template being disposed on said second surface.

5. The window assembly of claim 1 further comprising a plurality of photovoltaic devices disposed on said substrate and a plurality of first apertures coextensive respectively therewith.

6. The window assembly of claim 1 wherein the large area photovoltaic device is a thin film, silicon alloy photovoltaic device.

7. The window assembly of claim 1 wherein the layer of impervious material is ethylene vinyl acetate.

8. The window assembly of claim 7 further comprising an optically transmissive, polymeric coating disposed on said layer of impervious material.

9. The window assembly of claim 8 wherein said coating is formed of a fluoropolymer.

10. The window assembly of claim 1 further comprising at least one electrical connector in electrical communication with said photovoltaic device.

11. A photovoltaic sunroof module for use with a motor vehicle, said module comprising:
    a rigid, optically-transmissive substrate;
    at least one large area photovoltaic device disposed on and overlying a portion of said substrate;
    a decorative template disposed adjacent said photovoltaic device and having means forming a first aperture coextensive with said photovoltaic device and a second aperture defining a window opening;
    an encapsulating layer of optically transmissive material disposed on said substrate, photovoltaic device and template;
    an optically-transmissive polymeric coating disposed on said impervious layer; and
    an electrical connector in electrical communication with said photovoltaic device for electrical communication with the electrical system of said motor vehicle,
    wherein said first aperture exposes all of said device except for said connector thereof.

12. The sunroof panel of claim 11 further comprising an adhesive layer disposed between said template and adjacent photovoltaic device and said substrate to bond said template and adjacent photovoltaic device to said substrate.

13. The sunroof panel of claim 12 wherein said adhesive layer is formed of ethylene vinyl acetate.

14. The sunroof panel of claim 11 further comprising a plurality of photovoltaic devices and a plurality of first apertures coextensive respectively therewith.

15. The sunroof panel of claim 11 wherein the large area photovoltaic device is a thin film, silicon alloy photovoltaic device.

16. The sunroof panel of claim 11 wherein the encapsulating layer is formed of ethylene vinyl acetate.

17. The sunroof panel of claim 11 wherein the coating is formed of a fluoropolymer.

* * * * *